(12) United States Patent
Hao et al.

(10) Patent No.: US 11,887,401 B2
(45) Date of Patent: Jan. 30, 2024

(54) DISPLAY BACKPLANE, MANUFACTURING METHOD THEREOF, AND FULL-SCREEN FINGERPRINT IDENTIFICATION DISPLAY DEVICE

(71) Applicants: Beijing BOE Technology Development Co., Ltd., Beijing (CN); BOE Technology Group Co., Ltd., Beijing (CN)

(72) Inventors: Xueguang Hao, Beijing (CN); Hongfei Cheng, Beijing (CN); Yongda Ma, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 619 days.

(21) Appl. No.: 17/043,725
(22) PCT Filed: Apr. 20, 2020
(86) PCT No.: PCT/CN2020/085731
§ 371 (c)(1),
(2) Date: Sep. 30, 2020
(87) PCT Pub. No.: WO2020/248716
PCT Pub. Date: Dec. 17, 2020

(65) Prior Publication Data
US 2022/0383655 A1     Dec. 1, 2022

(30) Foreign Application Priority Data
Jun. 14, 2019   (CN) .......................... 201910514410.0

(51) Int. Cl.
*G06K 9/00*       (2022.01)
*G06V 40/13*      (2022.01)
(Continued)

(52) U.S. Cl.
CPC ....... *G06V 40/1318* (2022.01); *H10K 59/122* (2023.02); *H10K 59/124* (2023.02);
(Continued)

(58) Field of Classification Search
CPC .. G06V 40/1318; H10K 59/65; H10K 59/122; H10K 71/00; H10K 59/124; H10K 59/1201
(Continued)

(56) References Cited

U.S. PATENT DOCUMENTS

2010/0007632 A1* 1/2010 Yamazaki ............. G06F 3/0421
                                                                 345/175
2011/0221720 A1    9/2011 Kuo et al.
(Continued)

FOREIGN PATENT DOCUMENTS

CN         101976679 A      2/2011
CN         105046247 A     11/2015
(Continued)

OTHER PUBLICATIONS

International Search Report for PCT/CN2020/085731 dated Jul. 23, 2020.
(Continued)

*Primary Examiner* — Abdul-Samad A Adediran
(74) *Attorney, Agent, or Firm* — Ling Wu; Stephen Yang; Ling and Yang Intellectual Property

(57) ABSTRACT

The present disclosure provides a display backplane, a method for manufacturing the same and a full-screen fingerprint identification display device. The display backplane includes a substrate; a circuit layer disposed on a surface of the substrate; a light emitting device layer disposed on a surface of the circuit layer away from the substrate; and a plurality of fingerprint identification photodetectors disposed in at least one of the circuit layer and the light emitting device layer.

16 Claims, 8 Drawing Sheets

(51) Int. Cl.
  *H10K 59/65* (2023.01)
  *H10K 59/122* (2023.01)
  *H10K 59/124* (2023.01)
  *H10K 71/00* (2023.01)
  *H10K 59/12* (2023.01)

(52) U.S. Cl.
  CPC ............ *H10K 59/65* (2023.02); *H10K 71/00* (2023.02); *H10K 59/1201* (2023.02)

(58) Field of Classification Search
  USPC .......................................... 345/175; 600/328
  See application file for complete search history.

(56) References Cited

U.S. PATENT DOCUMENTS

| | | | |
|---|---|---|---|
| 2014/0350366 A1* | 11/2014 | Akiyama | H10K 65/00 600/328 |
| 2017/0270338 A1 | 9/2017 | Ding et al. | |
| 2018/0053032 A1 | 2/2018 | Ding et al. | |
| 2018/0060641 A1 | 3/2018 | Kim et al. | |
| 2019/0067385 A1 | 2/2019 | Xu et al. | |
| 2019/0294849 A1* | 9/2019 | Ma | G06V 40/1318 |

FOREIGN PATENT DOCUMENTS

| | | |
|---|---|---|
| CN | 107425038 A | 12/2017 |
| CN | 107579101 A | 1/2018 |
| CN | 108258024 A | 7/2018 |
| CN | 109216423 A | 1/2019 |
| CN | 109541839 A | 3/2019 |
| CN | 110245610 A | 9/2019 |

OTHER PUBLICATIONS

Office Action dated Aug. 27, 2020 for Chinese Patent Application No. 201910514410.0 and English Translation.
Office Action dated May 7, 2021 for Chinese Patent Application No. 201910514410.0 and English Translation.

* cited by examiner

DISPLAY BACKPLANE, MANUFACTURING METHOD THEREOF, AND FULL-SCREEN FINGERPRINT IDENTIFICATION DISPLAY DEVICE

CROSS-REFERENCE TO RELATED APPLICATIONS

The present application is a U.S. National Phase Entry of International Application No. PCT/CN2020/085731 having an international filing date of Apr. 20, 2020, which is based on and claims priority to the Chinese Patent Application No. 201910514410.0, filed on Jun. 14, 2019. The above-identified applications are incorporated herein by reference in their entireties.

TECHNICAL FIELD

The present disclosure relates to the field of display technology, and in particular, to a display backplane, a method for manufacturing the same and a full-screen fingerprint identification display device.

BACKGROUND

In related technologies, collection of fingerprints is usually implemented by a display device using the principle of pinhole imaging. However, this scheme needs the use of a high PPI (pixels per inch) image sensor, has high cost and can only enable the display device to implement fingerprint identification in local areas, but cannot enable the display device to implement full-screen fingerprint identification, so the user experience is poor.

Therefore, the related technologies of the existing display devices still need to be improved.

SUMMARY

The present disclosure is intended to solve one of the technical problems in the related art at least to some extent. To this end, an object of the present disclosure is to provide a display backplane which has simple structure and low cost, or can implement full-screen fingerprint identification.

In an aspect of the present disclosure, the present disclosure provides a display backplane. According to an embodiment of the present disclosure, the display backplane includes a substrate; a circuit layer disposed on a surface of the substrate; a light emitting device layer disposed on a surface of the circuit layer away from the substrate; and a plurality of fingerprint identification photodetectors disposed in at least one of the circuit layer and the light emitting device layer. The display backplane has simple structure and low cost, since the plurality of fingerprint identification photodetectors are disposed in the at least one of the circuit layer and the light emitting device layer in the display backplane and are located inside the display backplane, the display backplane can implement full-screen fingerprint identification.

According to an embodiment of the present disclosure, there is a first insulating layer in the circuit layer, there is a second insulating layer in the light emitting device layer, and the fingerprint identification photodetectors are embedded in at least one of the first insulating layer and the second insulating layer.

According to an embodiment of the present disclosure, the circuit layer includes a thin film transistor disposed on the surface of the substrate; and a planarization layer disposed on a surface of the thin film transistor away from the substrate, the planarization layer forming the first insulating layer, wherein the light emitting device layer includes: a pixel defining layer disposed on the surface of the circuit layer away from the substrate, the pixel defining layer defining a plurality of openings and forming the second insulating layer; and light emitting elements disposed in the openings.

According to an embodiment of the present disclosure, the fingerprint identification photodetector includes a first electrode and a second electrode, and the first electrode is electrically connected to a drain of the thin film transistor.

According to an embodiment of the present disclosure, the fingerprint identification photodetector is embedded in the first insulating layer, and the second electrode is electrically connected to an anode in a light emitting element.

According to an embodiment of the present disclosure, photosensitive surfaces of the fingerprint identification photodetectors are substantially parallel to the substrate.

According to an embodiment of the present disclosure, the fingerprint identification photodetector is embedded in the second insulating layer, and the second electrode is electrically connected to a VDD signal line of the circuit layer.

According to an embodiment of the present disclosure, the photosensitive surfaces of the fingerprint identification photodetectors are arranged obliquely relative to the substrate.

According to an embodiment of the present disclosure, included angles between the photosensitive surfaces of the fingerprint identification photodetectors and the substrate are greater than or equal to 15° and less than or equal to 45°.

According to an embodiment of the present disclosure, the fingerprint identification photodetectors are PIN photodiodes.

In an aspect of the present disclosure, the present disclosure provides a method for manufacturing the aforementioned display backplane. According to an embodiment of the present disclosure, the method includes forming a circuit layer on a surface of a substrate; forming a light emitting device layer on a surface of the circuit layer away from the substrate; and forming a plurality of fingerprint identification photodetectors in at least one of the circuit layer and the light emitting device layer to obtain the display backplane. The method is simple and convenient to operate, easy to implement and easy to be industrialized, and can effectively manufacture the aforementioned display backplane, and the manufactured display backplane has simple structure and lower cost, and can implement full-screen fingerprint identification.

According to an embodiment of the present disclosure, the method includes forming a thin film transistor on the surface of the substrate; forming a plurality of fingerprint identification photodetectors on a surface of the thin film transistor away from the substrate; and forming a planarization layer on surfaces of the thin film transistor and the fingerprint identification photodetectors away from the substrate.

According to an embodiment of the present disclosure, the method includes: forming the plurality of fingerprint identification photodetectors on the surface of the circuit layer away from the substrate; forming pixel defining layers defining a plurality of openings on the surfaces of the fingerprint identification photodetectors; and forming light emitting elements in the openings.

In another aspect of the present disclosure, the present disclosure provides a full-screen fingerprint identification display device. According to an embodiment of the present disclosure, the full-screen display device includes the display backplane described above. The full-screen fingerprint identification display device has simple structure and low cost, and can implement full-screen fingerprint identification, and has all features and advantages of the aforementioned display backplane, which will not be repeated herein.

REFERENCE SIGNS

Figure 1:
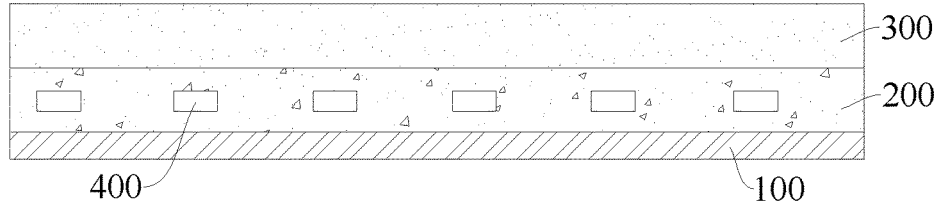
FIG. 1 shows a schematic cross-section view of a display backplane according to an embodiment of the present disclosure.

1: full-screen fingerprint identification display device; 10: display backplane; 11: touch screen outer frame area; 12: touch screen inner frame area; 13: inductive electrode; 14: driving electrode; 15: FPC binding area; 16: FPC wiring area; 17: connection area; 18: connector; 99: light; 100: substrate; 200: circuit layer; 210: first insulation layer; 211: planarization layer; 220: thin film transistor; 221: source; 222: drain; 223: gate; 224: active layer; 225: gate insulating layer; 226: interlayer insulating layer; 227: gate scanning line; 228: reading line; 230: gate insulating layer; 240: interlayer insulating layer; 250: VDD signal line; 300: light emitting device layer; 310: second insulating layer; 311: pixel defining layer; 320: light emitting element; 330: anode; 340: cathode; 400: fingerprint identification photodetector; 410: first electrode; 420: second electrode; 430: photosensitive surface; 500: packaging film; 600: color filter; 700: polarizer; 800: cover plate.

DETAILED DESCRIPTION

Embodiments of the present disclosure are described in detail below. The embodiments described below are exemplary and are intended to explain the present disclosure, but should not be construed as limitation to the present disclosure. The embodiments in which specific technologies or conditions are not indicated shall be carried out according to technologies or conditions described in literatures in the art or according to a product specification.

In an aspect of the present disclosure, the present disclosure provides a display backplane. According to an embodiment of the present disclosure, referring to FIGS. 1, 2 and 3, the display backplane 10 includes a substrate 100; a circuit layer 200 disposed on a surface of the substrate 100; a light emitting device layer 300 disposed on a surface of the circuit layer 200 away from the substrate 100; and a plurality of fingerprint identification photodetectors disposed in at least one of the circuit layer 200 and the light emitting device layer 300. The display backplane 10 has simple structure and low cost, and the plurality of fingerprint identification photodetectors 400 are disposed in the at least one of the circuit layer 200 and the light emitting device layer 300 in the display backplane 10 and are located inside the display backplane 10 such that the display backplane 10 can implement full-screen fingerprint identification.

According to an embodiment of the present disclosure, the substrate 100 may include a base substrate, a buffer layer and a light-shielding layer. The specific positions and modes in which the base substrate, buffer layer and light-shielding layer are disposed are all the same as the specific positions and modes in which the base substrate, buffer layer and light-shielding layer are disposed in the conventional display backplane, and this will not be repeated herein.

According to an embodiment of the present disclosure, specifically, as long as a plurality of fingerprint identification photodetectors 400 are disposed in at least one of the circuit layer 200 and the light emitting device layer 300, their specific positions is not particularly limited. For example, in some embodiments of the present disclosure, the plurality of fingerprint identification photodetectors 400 may be disposed in the circuit layer 200 (a schematic structure diagram refers to FIG. 1). In other embodiments of the present disclosure, the plurality of fingerprint identification photodetectors 400 may also be disposed in the light emitting device layer 300 (a structure diagram refers to FIG. 2). In yet other embodiments of the present disclosure, the plurality of fingerprint identification photodetectors 400 may also be disposed in the circuit layer 200 or the light emitting device layer 300 (a structure diagram refers to FIG. 3). Therefore, the positions and modes in which the fingerprint identification photodetectors 400 are disposed are flexible, and they are simple in structure and low in cost, and suitable for industrialization.

According to an embodiment of the present disclosure, the circuit layer 200 may include a thin film transistor, a gate insulating layer and an interlayer insulating layer. The specific positions and modes in which the thin film transistor, the gate insulating layer and the interlayer insulating layer are disposed are all the positions and modes in which the thin film transistor, the gate insulating layer and the interlayer insulating layer are disposed in the conventional display backplane, and this will not be repeated herein.

According to an embodiment of the present disclosure, the light-emitting device layer may include light emitting elements, cathodes and anodes. The specific positions and modes in which the light emitting elements, cathodes and anodes are disposed are all the positions and modes in which the light emitting elements, cathodes and anodes are disposed in the conventional display backplane, and this will not be repeated herein.

Figure 4:
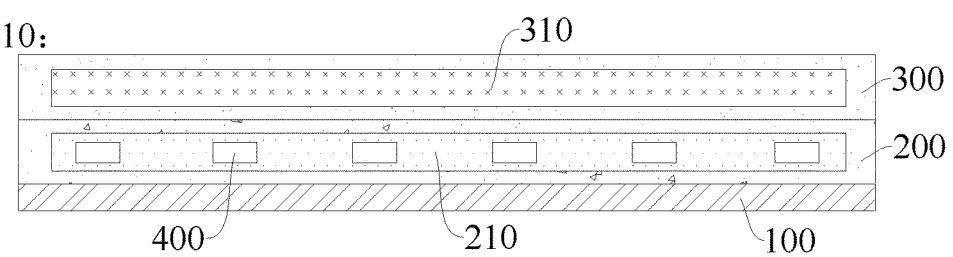
FIG. 4 shows a schematic cross-section view of a display backplane according to still further embodiment of the present disclosure.
Figure 5:
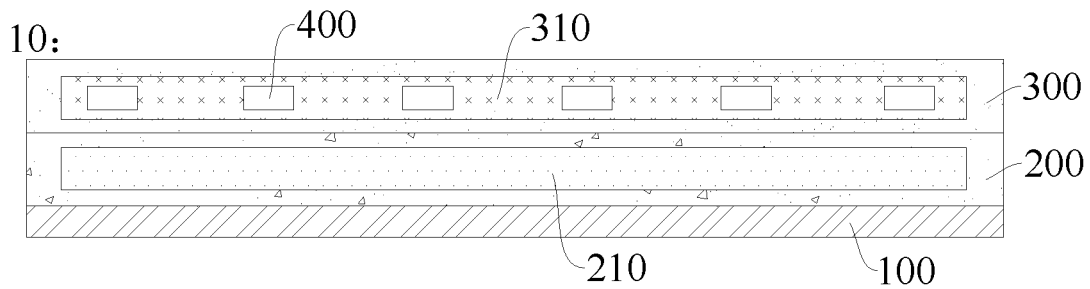
FIG. 5 shows a schematic cross-section view of a display backplane according to still another embodiment of the present disclosure.

According to an embodiment of the present disclosure, the fingerprint identification photodetectors may be embedded in the insulating layer. For example, in some embodiments of the present disclosure, referring to FIGS. 4 and 5, there is a first insulating layer 210 in the circuit layer 200, there is a second insulating layer 310 in the light emitting device layer 300, and the fingerprint identification photodetectors 400 are embedded in at least one of the first insulating layer 210 and the second insulating layer 310. Therefore, the fingerprint identification photodetectors 400 are embedded in the insulating layer, are easy to form, and are simple in manufacturing process and low in cost. Moreover, when the fingerprint identification photodetectors are electrically connected, no short circuit will occur, and the display backplane 10 can better implement full-screen fingerprint identification.

According to an embodiment of the present disclosure, further, when the fingerprint identification photodetectors are embedded in the insulating layer, their specific positions are not particularly limited as they are embedded in at least one of the first insulating layer 210 and the second insulating layer 310. For example, in some embodiments of the present disclosure, the fingerprint identification photodetectors 400 may be embedded in the first insulating layer 210 (a schematic structure diagram refers to FIG. 4); in other embodiments of the present disclosure, the fingerprint identification photodetectors 400 may also be embedded in the second insulating layer 310 (a schematic structure diagram refers to FIG. 5). Those skilled in the art can understand that in yet other embodiments of the present disclosure, the fingerprint identification photodetectors can also be embedded in the first insulating layer or the second insulating layer (not shown in the figure). Therefore, the positions and modes in which the fingerprint identification photodetectors 400 are disposed are flexible, and they are simple in structure and low in cost, and suitable for industrialization.

Figure 6:
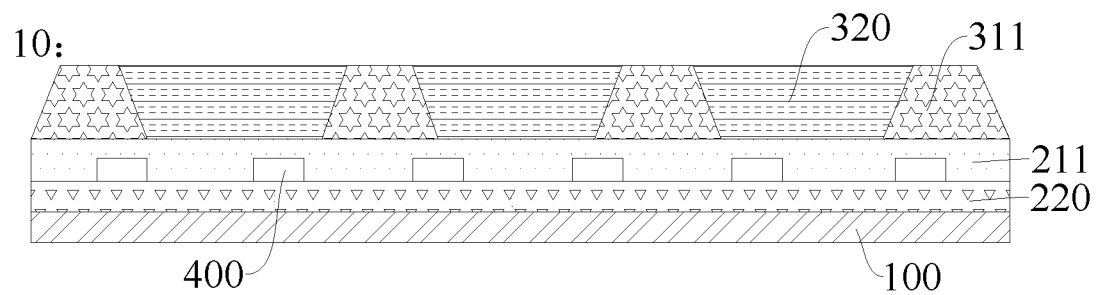
FIG. 6 shows a schematic cross-section view of a display backplane according to still another embodiment of the present disclosure.
Figure 7:
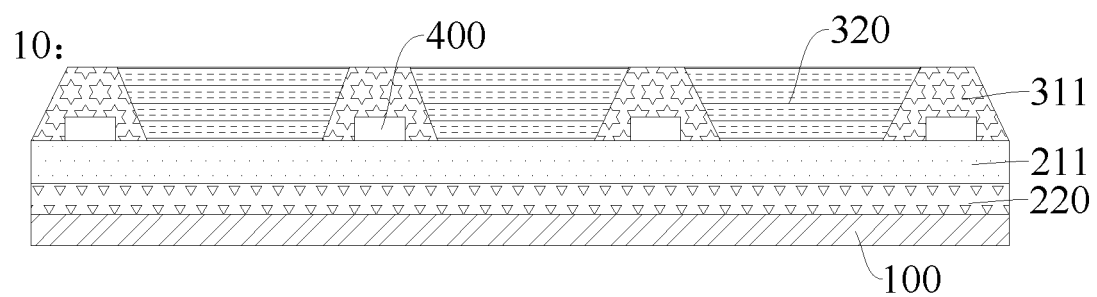
FIG. 7 shows a schematic cross-section view of a display backplane according to still another embodiment of the present disclosure.

According to an embodiment of the present disclosure, specifically, referring to FIGS. 6 and 7, the circuit layer includes a thin film transistor 220 disposed on a surface of the substrate 100; and a planarization layer 211 disposed on a surface of the thin film transistor 220 away from the substrate 100, the planarization layer 211 forming the first insulating layer. In addition, the light emitting device layer includes: a pixel defining layer 311 disposed on a surface of the circuit layer 200 away from the substrate 100, the pixel defining layer 311 defining a plurality of openings and forming the second insulating layer; and light emitting elements 320 disposed in the openings. Therefore, the fingerprint identification photodetectors 400 are directly embedded in the planarization layer 211 (a schematic structure diagram refers to FIG. 6) or the pixel defining layer 311 (a schematic structure diagram refers to FIG. 7) in the display backplane 10, and they are simple in structure, low in cost, and easy to implement, and can better implement full-screen fingerprint identification.

Figure 8:
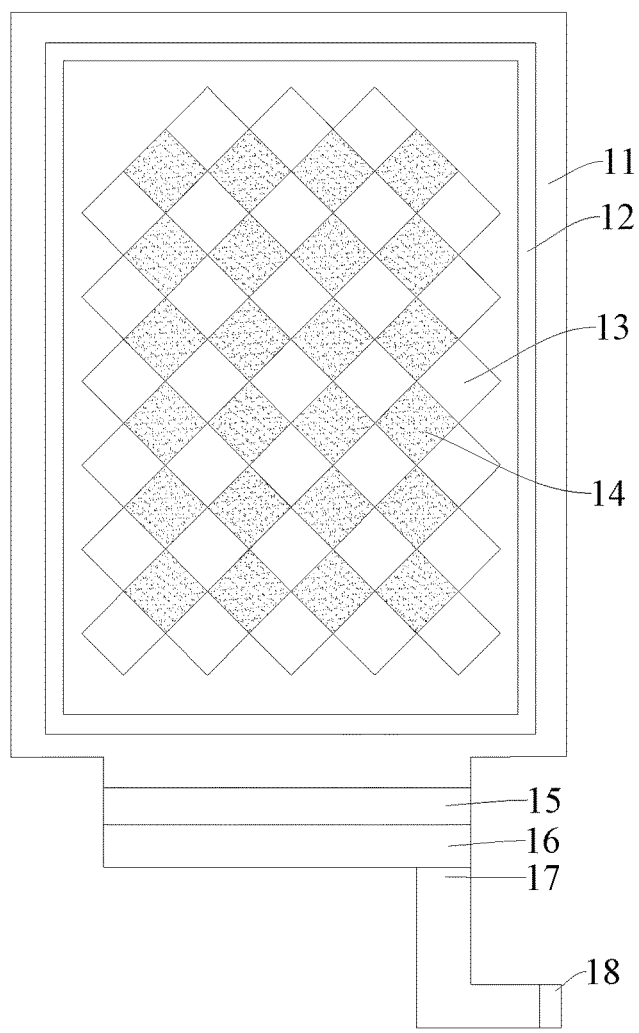
FIG. 8 shows a schematic plan view of a display backplane according to an embodiment of the present disclosure.

According to an embodiment of the present disclosure, further, referring to FIGS. 8, 9, 10 and 11, the display backplane includes a touch screen outer frame area 11, a touch screen inner frame area 12, an inductive electrode 13, a driving electrode 14, an FPC binding area (golden finger area) 15, an FPC wiring area 16, a connection area 17 and a connector 18 (a schematic structure diagram refers to FIG. 8). The fingerprint identification photodetector in the display backplane includes a first electrode 410 and a second electrode 420, and the first electrode 410 is electrically connected to a drain 222 of the thin film transistor (a schematic structure diagram refers to FIGS. 9 and 10). Therefore, the fingerprint identification photodetectors can be driven by the thin film transistor without additional setting of driving for the fingerprint identification photodetectors, so that the display backplane has simple structure, is easy to be industrialized, and can better implement full-screen fingerprint identification.

According to an embodiment of the present disclosure, further, when the first electrodes 410 are electrically connected to the drain 222 of the thin film transistor, the positions in which the fingerprint identification photodetectors are disposed and their electrical connection relationship are not particularly limited as long as the fingerprint identification photodetectors can operate. Specifically, in some embodiments of the present disclosure, the fingerprint identification photodetectors can be embedded in the first insulating layer, that is, embedded in the aforementioned planarization layer 211, at this point, the second electrodes 420 of the fingerprint identification photodetectors are electrically connected to anodes 330 in the light emitting elements (a schematic structure diagram refers to FIG. 9 and a circuit diagram refers to FIG. 11. It should be noted that $T_1$ represents a thin film transistor and $D_1$ represents a light emitting element in FIG. 11). In other embodiments of the present disclosure, the fingerprint identification photodetectors may be embedded in the second insulating layer, that is, embedded in the pixel defining layer 311 described above. In this case, the second electrode 420 of the fingerprint identification photodetector is electrically connected to the VDD signal line 250 of the circuit layer (a schematic structure diagram refers to FIG. 10 and a circuit diagram refers to FIG. 11). Therefore, the display backplane is simple in structure, low in cost, and easy to be industrialized, and can better implement full-screen fingerprint identification.

According to an embodiment of the present disclosure, as mentioned above, when the light emitting elements emit light, positions of ridges or valleys of fingers will be illuminated. The fingerprint identification photodetectors are disposed in the display backplane, and can receive different optical signals emitted from the ridges and valleys of the fingers. Because refractive indices of valley and ridge interfaces are different, intensities of lights reflected to the fingerprint identification photodetectors are different, and then the fingerprint identification photodetectors convert optical signals with different intensities into current signals with different intensities. A reading line 228 is controlled by the thin film transistor to read the current signals with different intensities, so as to determine the difference between different fingerprints, further implementing full-screen fingerprint identification.

Figure 9:
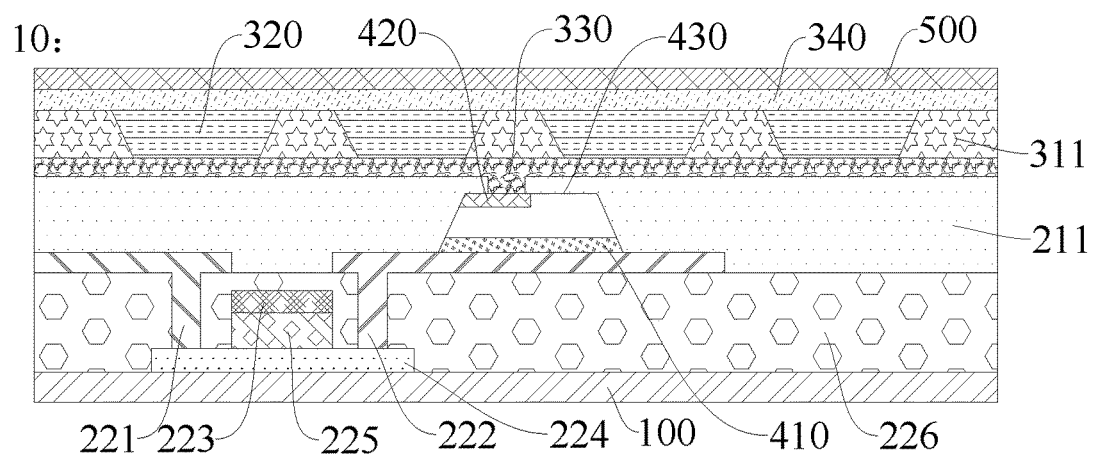
FIG. 9 shows a schematic cross-section view of the display backplane according to the embodiment in FIG. 8 of the present disclosure.

According to an embodiment of the present disclosure, when the fingerprint identification photodetectors are embedded in the aforementioned planarization layer 211, photosensitive surfaces 430 of the fingerprint identification photodetectors are substantially parallel to the substrate 100 (a schematic structure diagram refers to FIG. 9). Therefore, the display backplane is simple in structure on a whole, and the fingerprint identification photodetectors in the planarization layer are simple in manufacturing process, low in cost, and easy to be industrialized.

Figure 10:
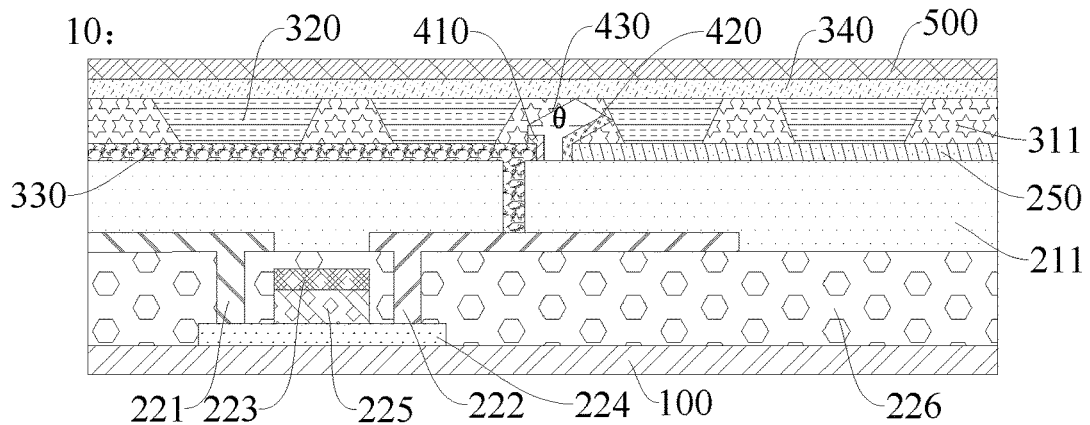
FIG. 10 shows another cross-section view of the display backplane according to the embodiment in FIG. 8 of the present disclosure.
Figure 11:
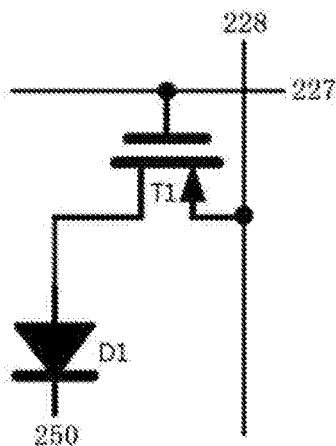
FIG. 11 shows a circuit diagram of various components of the display backplane according to the embodiment in FIG. 8 of the present disclosure.
Figure 12:
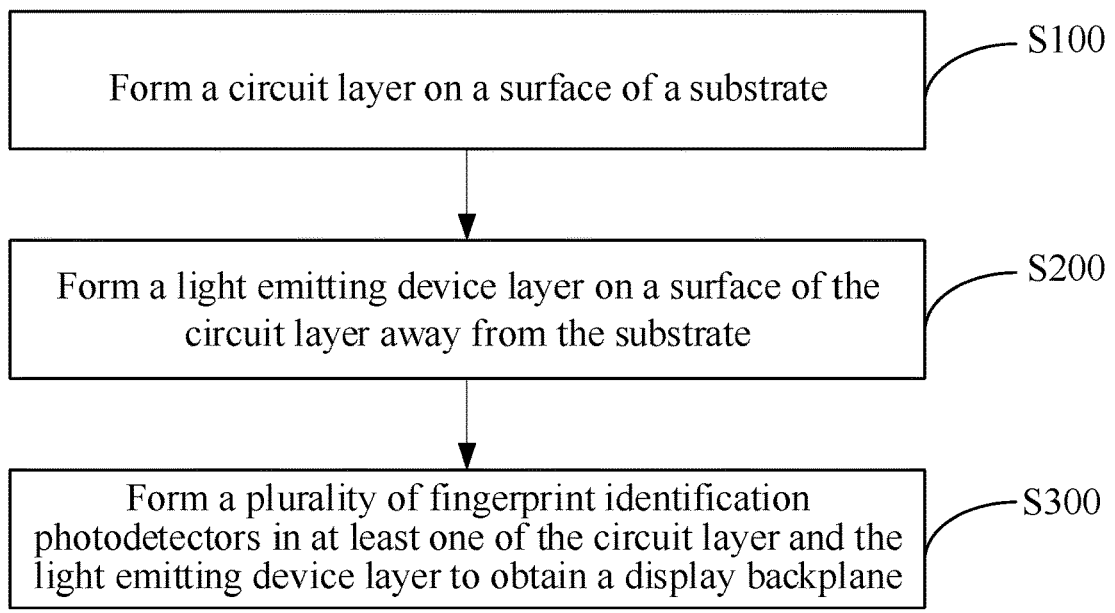
FIG. 12 shows a schematic flowchart of a method for manufacturing a display backplane according to an embodiment of the present disclosure.

According to an embodiment of the present disclosure, when the fingerprint identification photodetectors are embedded in the pixel defining layer 311, the photosensitive surfaces 430 of the fingerprint identification photodetectors are arranged obliquely relative to the substrate 100 (a schematic structure diagram refers to FIG. 10). Therefore, since the photosensitive surfaces 430 of the fingerprint identification photodetectors are arranged obliquely relative to the substrate 100, the amount of light absorption of the fingerprint identification photodetectors can be increased compared with a configuration mode in which the photosensitive surfaces 430 are substantially parallel to the substrate 100, so that the intensity of light received by the fingerprint identification photodetectors is higher, which is beneficial to fingerprint identification.

According to an embodiment of the present disclosure, the inventor has found, after a profound study of the inclination degree of the photosensitive surfaces 430 of the fingerprint identification photodetectors relative to the substrate 100, that when an included angle θ between the photosensitive surfaces 430 of the fingerprint identification photodetectors and the substrate 100 is greater than or equal to 15° and less than or equal to 45° (specifically, the included angle θ may be 15°, 20°, 25°, 30°, 35°, 40° or 45°, etc.), light rays can be incident substantially perpendicular to the photosensitive surface 430, so that the amount of light absorption of the fingerprint identification photodetectors can be further increased, thereby further improving the intensity of light received by the fingerprint identification photodetectors, and further facilitating fingerprint identification.

In some specific embodiments of the present disclosure, the fingerprint identification photodetectors may be PIN photodiodes. Therefore, the fingerprint identification photodetectors have small junction capacitance, short transit time, high sensitivity, low cost and simple structure, are easy to be industrialized, and can better implement full-screen fingerprint identification.

In one aspect of the present disclosure, the present disclosure provides a method for manufacturing the aforementioned display backplane. According to an embodiment of the present disclosure, referring to FIGS. 12, 13a and 13b, 1, 2 and 3, the method includes the following steps.

Figure 13A:
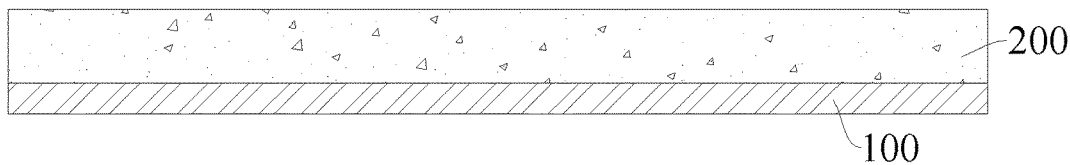
FIGS. 13a and 13b show a schematic flowchart of a method for manufacturing a display backplane according to another embodiment of the present disclosure.

In S100, a circuit layer 200 is formed on a surface of a substrate 100 (a schematic structure diagram refers to FIG. 13a).

According to an embodiment of the present disclosure, the step of forming the circuit layer 200 may include forming a buffer layer on the base substrate, and then forming an active layer on a surface of the buffer layer, the specific processes may be conventional processes of forming the buffer layer and forming the active layer. Specifically, the active layer may be formed after exposure, etching and development. Therefore, the operation is simple, convenient, easy to implement and easy to be industrialized.

According to an embodiment of the present disclosure, the step of forming the circuit layer 200 further includes the step of performing N-type or P-type doping on a source region and a drain region on the active layer mentioned above, so as to form a source contact region and a drain contact region on the surface of the active layer, the specific process may be a conventional doping process, and will not be repeated herein. Therefore, the operation is simple, convenient, easy to implement and easy to be industrialized.

According to an embodiment of the present disclosure, the step of forming the circuit layer 200 further includes steps of forming a gate insulating layer on a surface of the active layer and forming a gate on a surface of the gate insulating layer away from the active layer, the specific processes may be conventional processes, and will not be repeated herein. Therefore, the operation is simple, convenient, easy to implement and easy to be industrialized.

According to an embodiment of the present disclosure, the step of forming the circuit layer 200 further includes steps of forming an interlayer insulating layer and forming an interlayer insulating layer via hole in contact with the aforementioned source region and the drain region through exposure, etching and development processes, the specific processes may be conventional processes. A structure of the formed via hole is the same as that in the conventional interlayer insulating layer, and will not repeated herein. Therefore, the operation is simple, convenient, easy to implement and easy to be industrialized.

According to an embodiment of the present disclosure, the step of forming the circuit layer 200 further includes a step of forming a source and a drain and a step of forming a reading line in a display backplane, the specific processes may be conventional processes, and will not be repeated herein. Therefore, the operation is simple, convenient, easy to implement and easy to be industrialized.

According to an embodiment of the present disclosure, the step of forming the circuit layer further includes a step of forming a planarization layer, the process may be a conventional process, and will not be repeated herein. Therefore, the operation is simple, convenient, easy to implement and easy to be industrialized.

Figure 13B:
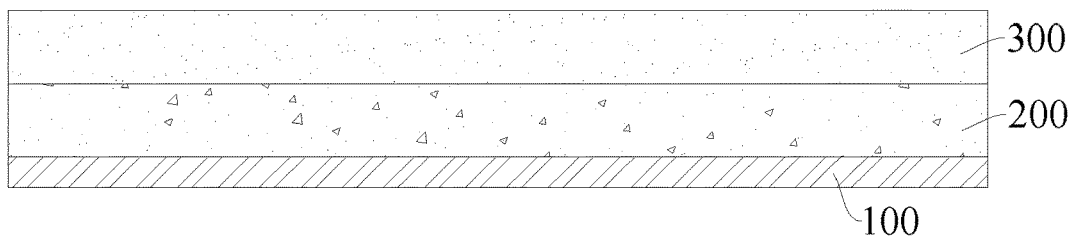
Figure 14:
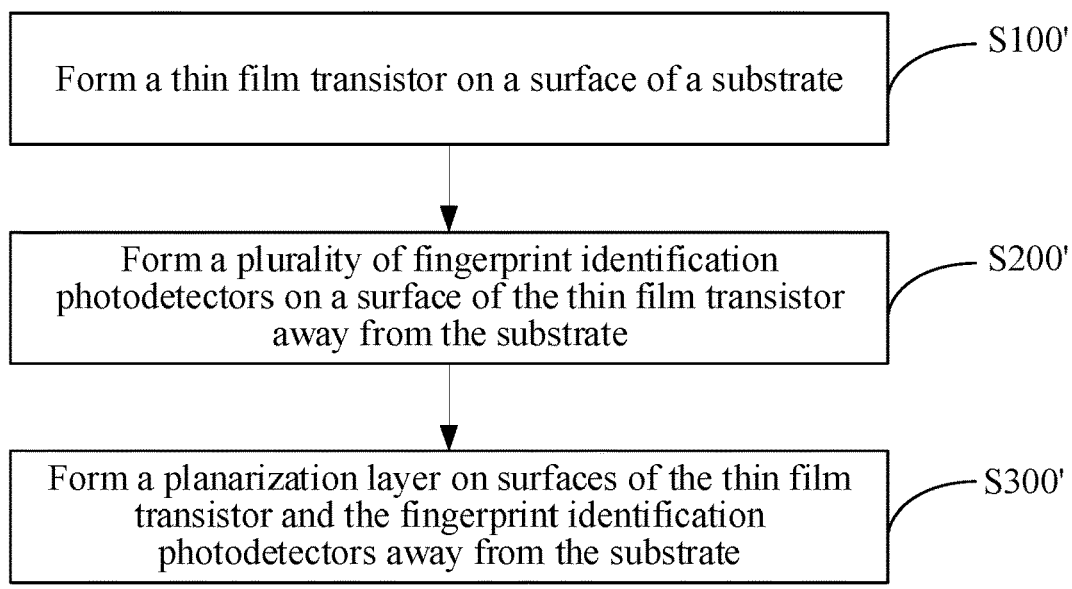
FIG. 14 shows a schematic flowchart of a method for manufacturing a display backplane according to still another embodiment of the present disclosure.

In S200, a light emitting device layer 300 is formed on the surface of the circuit layer 200 away from the substrate 100 (a schematic structure diagram refers to FIG. 13b).

According to the embodiment of the present disclosure, the step of forming the light-emitting device layer 300 may include steps of forming anodes, pixel defining layers, light emitting elements, cathodes, a packaging film, the specific processes may be conventional processes, and will not be repeated herein. Therefore, the operation is simple, convenient, easy to implement and easy to be industrialized.

Figure 2:
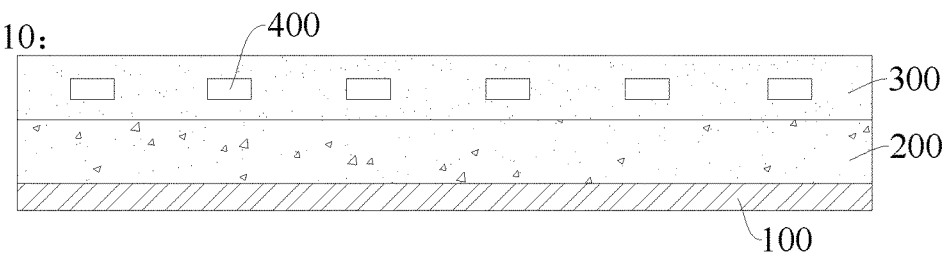
FIG. 2 shows a schematic cross-section view of a display backplane according to another embodiment of the present disclosure.
Figure 3:
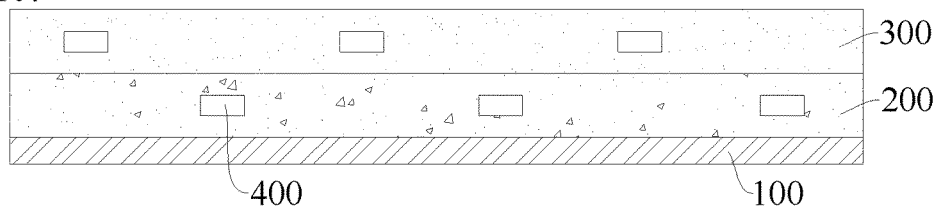
FIG. 3 shows a schematic cross-section view of a display backplane according to still another embodiment of the present disclosure.

In S300, a plurality of fingerprint identification photodetectors 400 are formed in at least one of the circuit layer 200 and the light emitting device layer 300, so as to obtain the display backplane 10 (a schematic structure diagram refers to FIGS. 1, 2 and 3).

Specifically, in some embodiments of the present disclosure, the plurality of fingerprint identification photodetectors may be formed in the planarization layer of the circuit layer (a schematic structure diagram of the manufactured display backplane refers to FIG. 9). In other embodiments of the present disclosure, the plurality of fingerprint identification photodetectors may also be formed in the pixel defining layer of the light emitting device layer (a schematic structure diagram of the manufactured display backplane refers to FIG. 10). Therefore, the aforementioned display backplane can be effectively manufactured, and specific features and advantages of the display backplane are the same as those described above, and will not be repeated herein.

In a specific embodiment of the present disclosure, when the plurality of fingerprint identification photodetectors are formed in the planarization layer of the circuit layer 200, referring to FIG. 14 and FIGS. 15*a* to 15*d*, the method may include the following steps.

Figure 15A:
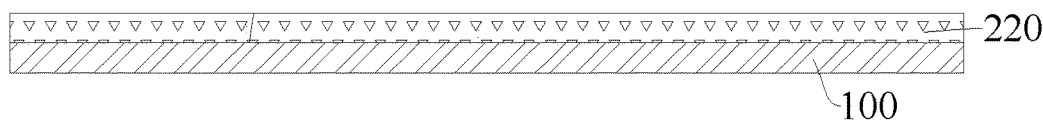
FIGS. 15a, 15b, 15c, and 15d show a schematic flowchart of a method for manufacturing a display backplane according to still another embodiment of the present disclosure.

In S100', a thin film transistor 220 is formed on the surface of the substrate 100 (a schematic structure diagram refers to FIG. 15*a*).

Figure 15B:
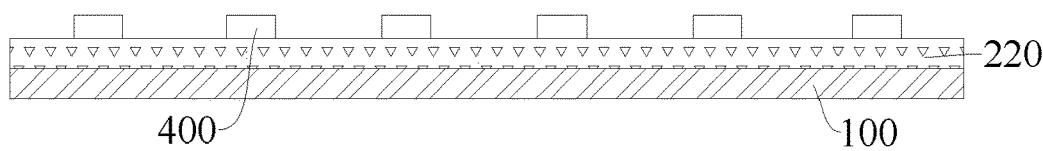

In S200', the plurality of fingerprint identification photodetectors 400 are formed on a surface of the thin film transistor 220 away from the substrate 100 (a schematic structure diagram refers to FIG. 15*b*).

Figure 15C:
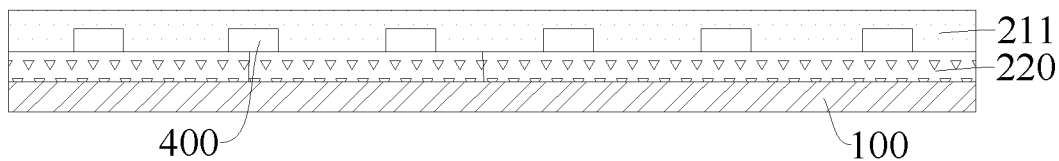
Figure 15D:
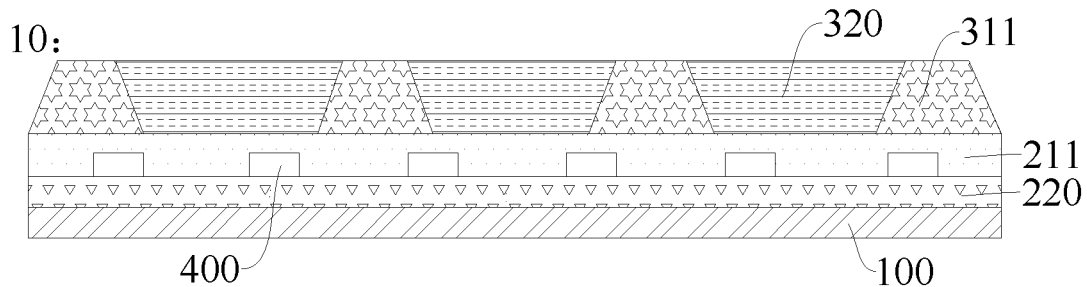
Figure 16:
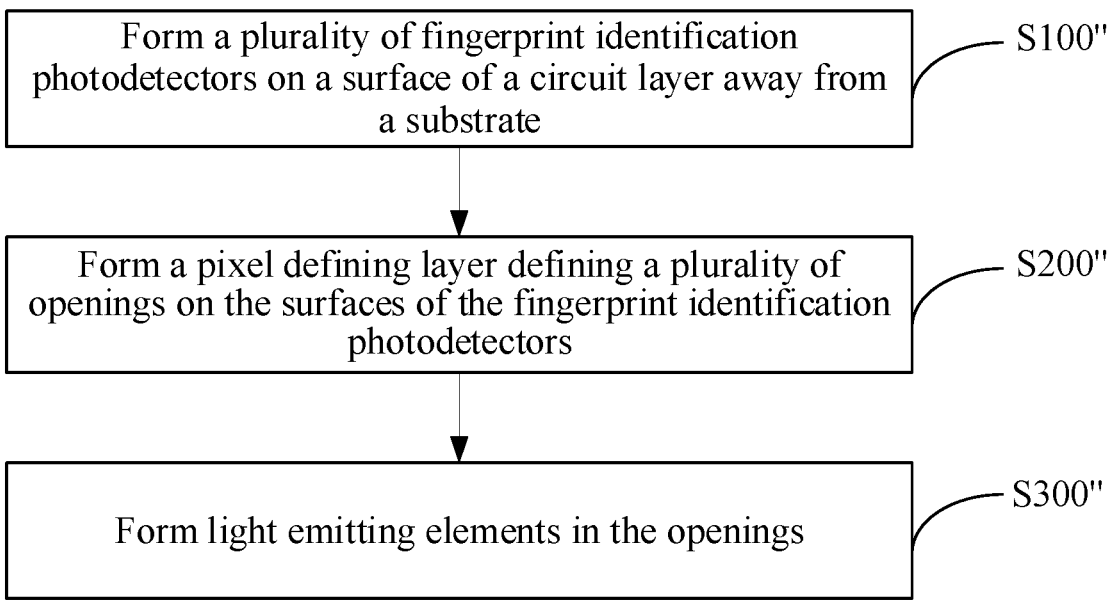
FIG. 16 shows a flowchart of a method for manufacturing a display backplane according to still another embodiment of the present disclosure.

In S300', a planarization layer 211 is formed on surfaces of the thin film transistor 220 and the fingerprint identification photodetectors 400 away from the substrate 100 (a schematic structure diagram refers to FIG. 15*c*).

According to an embodiment of the present disclosure, after the planarization layer 211 is formed, steps of forming the pixel defining layer 311 and forming light emitting elements 320 may be further included. A schematic structure diagram of the manufactured display backplane refers to FIG. 15*d*, and the processes of the previous steps may be conventional processes, and will not be repeated herein.

In another specific embodiment of the present disclosure, when the plurality of fingerprint identification photodetectors are formed in the pixel defining layer of the light emitting device layer, referring to FIG. 16 and FIGS. 17*a* to 17*c*, the method may include the following steps.

Figure 17A:
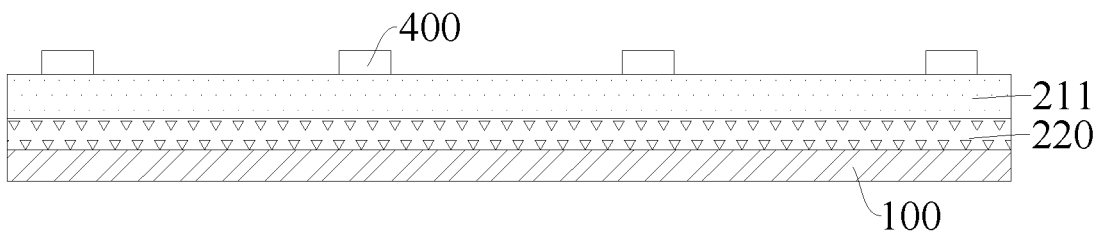
FIGS. 17a, 17b and 17c show a flowchart of a method for manufacturing a display backplane according to still another embodiment of the present disclosure.

In S100", the plurality of fingerprint identification photodetectors 400 are formed on the surface of the circuit layer (including the thin film transistor 220 and the planarization layer 211) away from the substrate 100 (a schematic structure diagram refers to FIG. 17*a*).

According to an embodiment of the present disclosure, both the step and process of forming the circuit layer including the thin film transistor 220 and the planarization layer 211 on the substrate are the same as those described above, and will not be repeated herein.

Figure 17B:
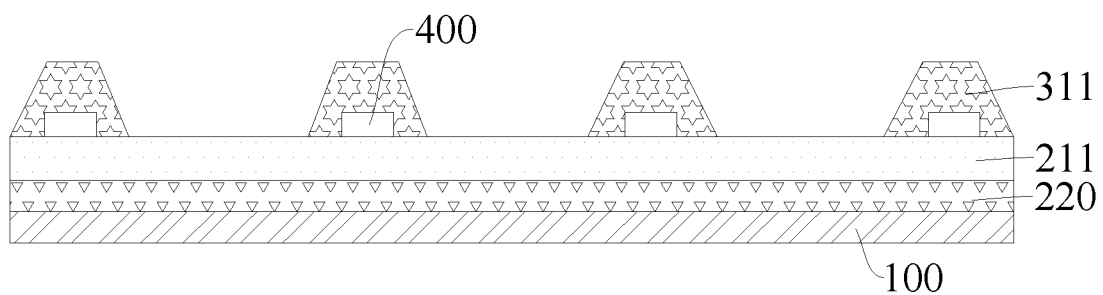

In S200", the pixel defining layers 311 defining a plurality of openings are formed on surfaces of the fingerprint identification photodetectors 400 (a schematic structure diagram refers to FIG. 17*b*).

Figure 17C:
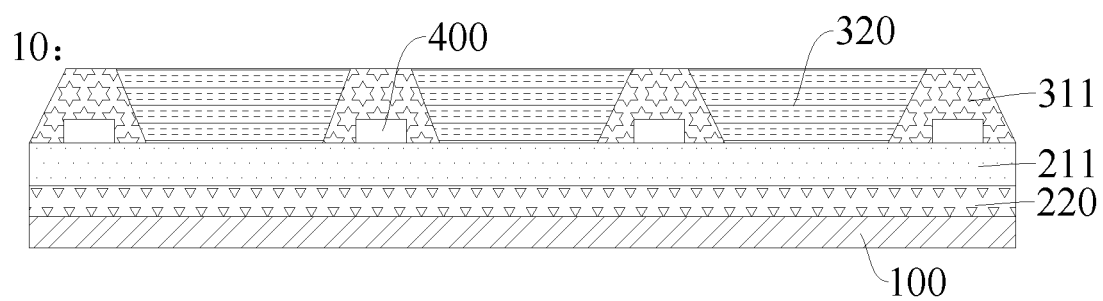

In S300", light emitting elements 320 are formed in the openings (a schematic structure diagram refers to FIG. 17*c*).

According to embodiments of the present disclosure, the processes of the above steps can all be conventional processes, and will not be repeated herein.

Figure 18:
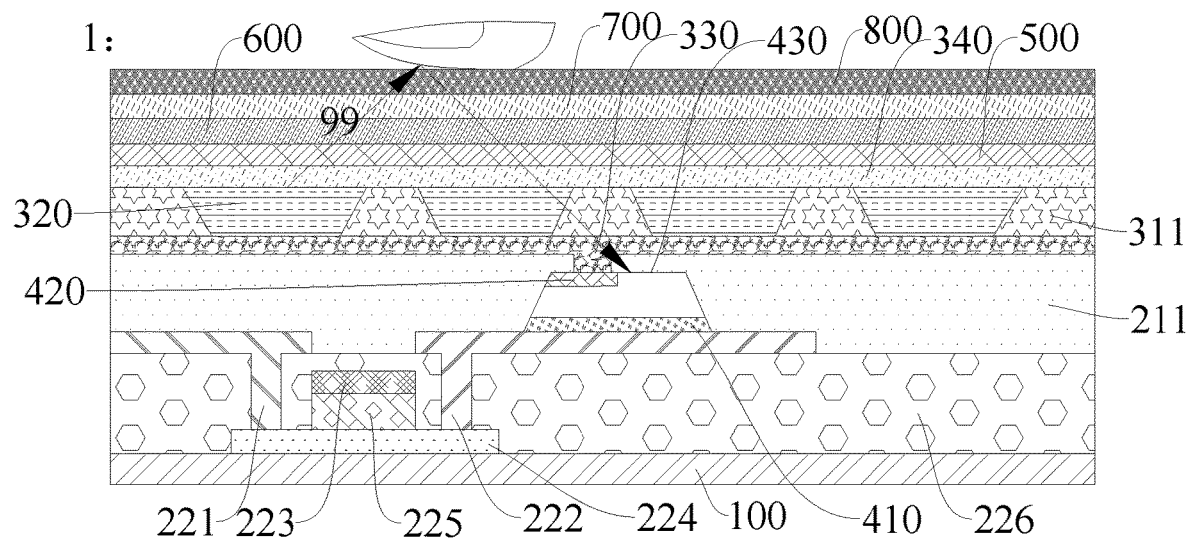
FIG. 18 shows a schematic cross-section view of a full-screen fingerprint identification display device according to an embodiment of the present disclosure.
Figure 19:
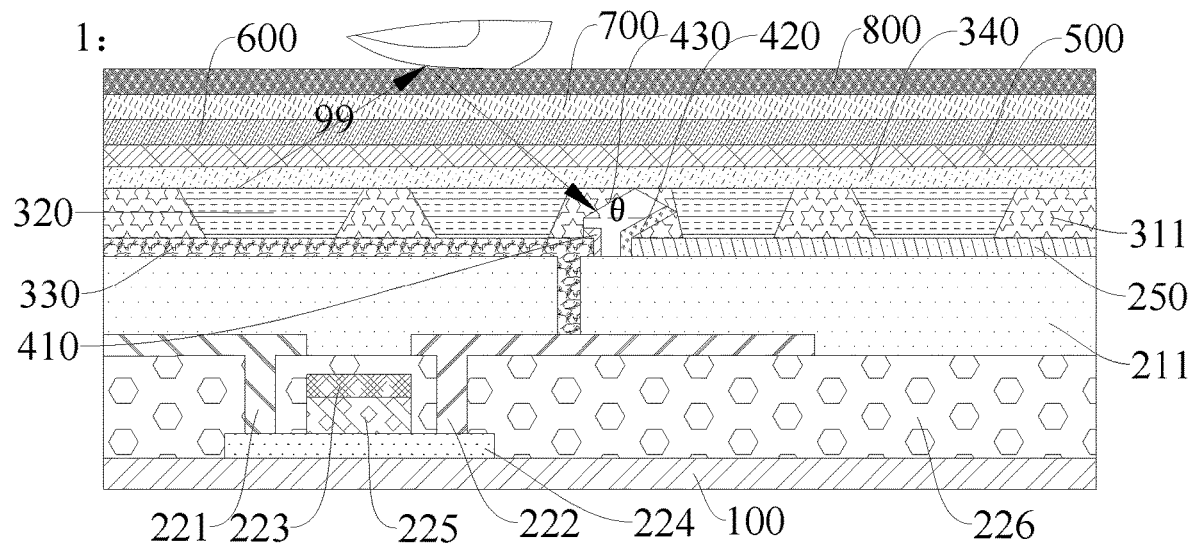
FIG. 19 shows a schematic cross-section view of a full-screen fingerprint identification display device according to another embodiment of the present disclosure.

In another aspect of the present disclosure, the present disclosure provides a full-screen fingerprint identification display device. According to an embodiment of the present disclosure, referring to FIGS. 18 and 19, the full-screen display device 1 includes the aforementioned display backplane. As described above, when the light emitting elements emit light 99, positions of ridges or valleys of fingers will be illuminated. The fingerprint identification photodetectors are disposed in the full-screen fingerprint identification display device, and can receive different optical signals emitted from the ridges and valleys of the fingers. Because refractive indices of valley and ridge interfaces are different, intensities of lights reflected to the fingerprint identification photodetectors are different, and then the fingerprint identification photodetectors convert optical signals with different intensities into current signals with different intensities. A reading line is controlled by the thin film transistor to read the current signals with different intensities, so as to determine the difference between different fingerprints, further implementing full-screen fingerprint identification. Moreover, the full-screen fingerprint identification display device 1 has simple structure and low cost, and has all the features and advantages of the display backplane described above, which will not repeated herein.

According to embodiments of the present disclosure, it can be understood by those skilled in the art that in addition to the structure described above, the full-screen fingerprint identification display device further includes the structure and components of a conventional display device, which will not be repeated herein.

According to embodiments of the present disclosure, the type of the full-screen fingerprint identification display device is not particularly limited, and can specifically include, but is not limited to, mobile phones, game machines, readers, tablet computers, and the like.

In addition, the terms "first" and "second" are used for the purpose of description only, and cannot be understood as indication or implication of relative importance or implicit indication of the number of the mentioned technical features. Thus, features defined by "first" and "second" may include one or more of the features explicitly or implicitly. In the description of the present disclosure, the meaning of "a plurality of" is two or more than two, unless defined otherwise explicitly.

In the present disclosure, unless otherwise clearly specified and defined, the first feature being "on" or "under" the second feature may mean that the first and second features are in direct contact, or the first and second features are in indirect contact through an intermediary. Moreover, the first feature being "over", "above" and "on" the second feature may mean that the first feature is directly above or obliquely above the second feature, or simply mean that a height of the first feature from a horizon is greater than that of the second feature. The first feature being "below", "beneath" and "under" the second feature may mean that the first feature is directly below or obliquely below the second feature, or simply mean that a height of the first feature from a horizon is less than that of the second feature.

In the description of the specification, description made with reference to terms "an embodiment", "some embodiments", "an example", "a specific example" or "some examples" means that a specific feature, structure, material, or characteristic described in connection with the embodiment or example is included in at least one embodiment or example of the present disclosure. In this specification, the schematic expression of the above-mentioned terms is not necessarily directed to the same embodiment or example. Moreover, the specific feature, structure, material, or characteristic described may be combined in a proper way in any one or more embodiments or examples. In addition, those skilled in the art may incorporate and combine different embodiments or examples and features of the different embodiments or examples described in this specification without conflict.

Although the embodiments of the present disclosure have been shown and described above, it should be understood that the above embodiments are exemplary, and will not be understood as the limitation to the present disclosure. Alterations, modifications, substitutions and variations to the above embodiments may be made by those skilled in the art within the scope of the present disclosure.

What we claim is:

1. A display backplane, comprising:
   a substrate;
   a circuit layer disposed on a surface of the substrate;
   a light emitting device layer disposed on a surface of the circuit layer away from the substrate; and
   a plurality of fingerprint identification photodetectors disposed in at least one of the circuit layer and the light emitting device layer,
   wherein included angles between photosensitive surfaces of the fingerprint identification photodetectors and the substrate are greater than or equal to 15° and less than or equal to 45°.

2. The display backplane according to claim 1, wherein the circuit layer contains a first insulating layer, the light emitting device layer contains a second insulating layer, and the fingerprint identification photodetectors are embedded in at least one of the first insulating layer and the second insulating layer.

3. The display backplane according to claim 2, wherein the circuit layer comprises:
   a thin film transistor disposed on the surface of the substrate; and
   a planarization layer disposed on a surface of the thin film transistor away from the substrate, the planarization layer forming the first insulating layer,
   wherein the light emitting device layer comprises:
   a pixel defining layer disposed on the surface of the circuit layer away from the substrate, the pixel defining layer defining a plurality of openings and forming the second insulating layer; and
   light emitting elements disposed in the openings.

4. The display backplane according to claim 3, wherein each of the fingerprint identification photodetectors comprises a first electrode and a second electrode, the first electrode is electrically connected to a drain of the thin film transistor.

5. The display backplane according to claim 4, wherein each of the fingerprint identification photodetectors is embedded in the first insulating layer, and the second electrode is electrically connected to an anode in one of the light emitting elements.

6. The display backplane according to claim 1, wherein the photosensitive surfaces of the fingerprint identification photodetectors are substantially parallel to the substrate.

7. The display backplane according to claim 4, wherein each of the fingerprint identification photodetectors is embedded in the second insulating layer, and the second electrode is electrically connected to a VDD signal line of the circuit layer.

8. The display backplane according to claim 1, wherein the photosensitive surfaces of the fingerprint identification photodetectors are arranged obliquely relative to the substrate.

9. The display backplane according to claim 1, wherein the fingerprint identification photodetectors are PIN photodiodes.

10. A full-screen fingerprint identification display device comprising the display backplane according to claim 1.

11. The display backplane according to claim 2, wherein the circuit layer comprises:
    a thin film transistor disposed on the surface of the substrate; and
    a planarization layer disposed on a surface of the thin film transistor away from the substrate, the planarization layer forming the first insulating layer,
    wherein the light emitting device layer comprises:
    a pixel defining layer disposed on the surface of the circuit layer away from the substrate, the pixel defining layer defining a plurality of openings and forming the second insulating layer; and
    light emitting elements disposed in the openings.

12. The display backplane according to claim 3, wherein each of the fingerprint identification photodetectors comprises a first electrode and a second electrode, the first electrode is electrically connected to a drain of the thin film transistor.

13. The display backplane according to claim 2, wherein the photosensitive surfaces of the fingerprint identification photodetectors are substantially parallel to the substrate.

14. The display backplane according to claim 3, wherein the photosensitive surfaces of the fingerprint identification photodetectors are substantially parallel to the substrate.

15. The display backplane according to claim 4, wherein the photosensitive surfaces of the fingerprint identification photodetectors are substantially parallel to the substrate.

16. The display backplane according to claim 5, wherein the photosensitive surfaces of the fingerprint identification photodetectors are substantially parallel to the substrate.

* * * * *